United States Patent
Sethi et al.

(10) Patent No.: US 9,842,951 B2
(45) Date of Patent: Dec. 12, 2017

(54) ENCAPSULANTS FOR PHOTOVOLTAIC MODULES

(71) Applicant: SUNPOWER CORPORATION, San Jose, CA (US)

(72) Inventors: Sunny Sethi, San Bruno, CA (US); David Okawa, San Bruno, CA (US)

(73) Assignee: SunPower Corporation, San Jose, CA (US)

( * ) Notice: Subject to any disclaimer, the term of this patent is extended or adjusted under 35 U.S.C. 154(b) by 25 days.

(21) Appl. No.: 14/318,469

(22) Filed: Jun. 27, 2014

(65) Prior Publication Data

US 2015/0380585 A1 Dec. 31, 2015

(51) Int. Cl.
| | |
|---|---|
| *H01L 21/00* | (2006.01) |
| *H01L 31/048* | (2014.01) |
| *H01L 31/055* | (2014.01) |
| *H01L 31/049* | (2014.01) |
| *H02S 40/42* | (2014.01) |
| *B32B 27/00* | (2006.01) |
| *B32B 15/18* | (2006.01) |

(52) U.S. Cl.
CPC ............ *H01L 31/048* (2013.01); *B32B 15/18* (2013.01); *B32B 27/00* (2013.01); *H01L 31/049* (2014.12); *H01L 31/0481* (2013.01); *H01L 31/055* (2013.01); *H02S 40/42* (2014.12); *B32B 2307/206* (2013.01); *B32B 2307/302* (2013.01); *B32B 2307/412* (2013.01); *B32B 2457/12* (2013.01); *Y02E 10/52* (2013.01)

(58) Field of Classification Search
CPC .. H01L 31/048; H01L 31/049; H01L 31/0481
USPC ....................................... 438/57, 67; 136/251
See application file for complete search history.

(56) References Cited

U.S. PATENT DOCUMENTS

| | | |
|---|---|---|
| 2009/0256254 A1 | 10/2009 | Burdick, Jr. et al. |
| 2010/0326522 A1 | 12/2010 | Okaniwa |
| 2011/0036390 A1 | 2/2011 | Nelson et al. |
| 2011/0146762 A1 | 6/2011 | Temchenko et al. |
| 2011/0160359 A1 | 6/2011 | Kempe et al. |
| 2012/0305055 A1* | 12/2012 | Woo .................... H01L 31/0481 136/251 |

FOREIGN PATENT DOCUMENTS

JP WO 2012096283 A1 * 7/2012 ........... H01L 31/048

OTHER PUBLICATIONS

International Search Report and Written Opinion for PCT Patent Application No. PCT/US2015/037826 dated Oct. 13, 2015, 16 pgs.
International Preliminary Report on Patentability for PCT Patent Application No. PCT/US2015/037826 dated Jan. 5, 2017, 12 pgs.

* cited by examiner

*Primary Examiner* — Brook Kebede
(74) *Attorney, Agent, or Firm* — Schwabe, Williamson & Wyatt, P.C.

(57) ABSTRACT

A photovoltaic (PV) Module can include a substantially transparent cover, first encapsulant, a solar cell and a second encapsulant. The second encapsulant can be configured to allow thermal communication between the solar cell and a heat sink. Various configurations and methods of making the same are presented.

20 Claims, 4 Drawing Sheets

ENCAPSULANTS FOR PHOTOVOLTAIC MODULES

BACKGROUND

Photovoltaic (PV) cells, commonly known as solar cells, are well known devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. Solar cells can be combined in a solar cell string. Solar cell strings can be combined with encapsulants to form an array such as a PV module, the electrical energy collected from all of the solar cells can be combined in series and parallel arrangements to provide power with a certain voltage and current.

Encapsulants can provide electrical insulation, reduce moisture ingress and optically couple a substantially transparent cover (e.g. glass) to the PV cells. Encapsulants can also protect components of the PV module from mechanical stress and corrosion. Accordingly, PV modules with improved encapsulants are generally desirable. Various examples are provided throughout.

DETAILED DESCRIPTION

Figure 1:
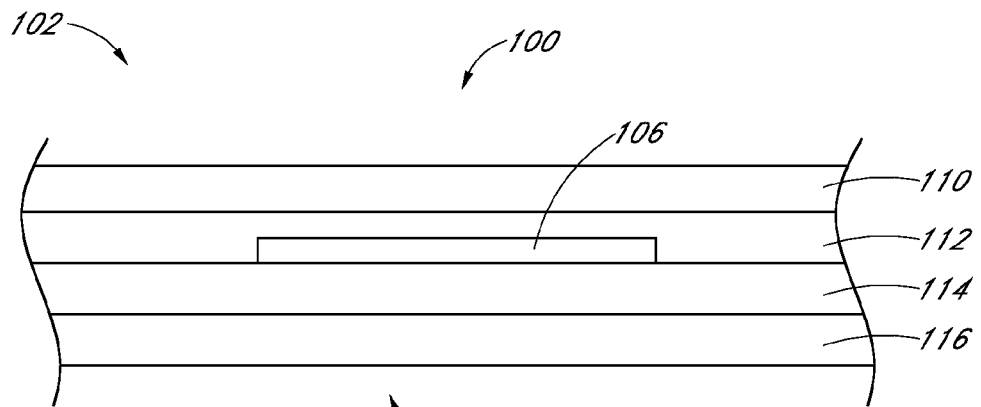
FIG. 1 illustrates a cross-sectional view of an example PV module, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" encapsulant does not necessarily imply that this encapsulant is the first encapsulant in a sequence; instead the term "first" is used to differentiate this encapsulant from another encapsulant (e.g., a "second" encapsulant).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

"Regions"—As used herein, regions can be used to describe discrete particles or locations of an object. In an example, a plurality of encapsulant regions can describe a plurality of encapsulant particles or lines (e.g. silicone particles, discontinuous or continuous lines of encapsulant, etc.).

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification first describes example PV modules, followed by a more detailed explanation of various embodiments of PV modules. The specification then includes a description of an example method for forming the disclosed PV modules. Various examples are provided throughout.

Turning to FIG. 1, an example PV module 100 is shown. The PV module 100 can include a substantially transparent cover 110 made of glass or other substantially transparent material. Substantially transparent is used herein to mean transmission of light through the region of material can be greater than 80% for light in the ranges of 300-1200 nm. The PV module 100 can have a front side 102 that faces the sun during normal operation and a backside 104 opposite the front side. The solar cell 106 can also have a front and back side aligned with the front and back side 102, 104 of the PV module respectively. In certain embodiments, the material chosen for construction of the substantially transparent cover 110 can be selected for properties which minimize reflection, thereby permitting the maximum amount of sunlight to reach the solar cell 106. The substantially transparent cover 110 can provide structural rigidity to the PV module 100.

The PV module 100 can also include one or more encapsulants 112, 114 which surround and enclose one or more solar cells, such as a solar cell 106. FIG. 1 (and FIGS. 2 and 3) illustrate a single solar cell for ease of illustration and explanation but in many examples, multiple solar cells are interconnected together and surrounded and enclosed by encapsulant. In an embodiment, the first encapsulant 112 and a second encapsulant 114 can be on opposite sides of solar cells 106.

The PV module 100 can also have a backsheet 116. The backsheet 116 can be an electrically insulating region which protects the underside of the PV module 100. The backsheet 116 can be a polymer sheet or composed of glass. In an embodiment, the backsheet 116 can also be substantially transparent. In some embodiments, the backsheet 100 can be colored (e.g. white). The substantially transparent top cover 110, the first encapsulant 112, solar cell 106, second encapsulant 114 and the backsheet 116 can be cured and/or laminated in a step to form a PV laminate. In an embodiment, curing can include the process by which two interfaces (e.g., encapsulants with substantially transparent top cover and/or backsheet) are optically and/or thermally coupled and/or the process by which two materials are bonded together.

Figure 2:
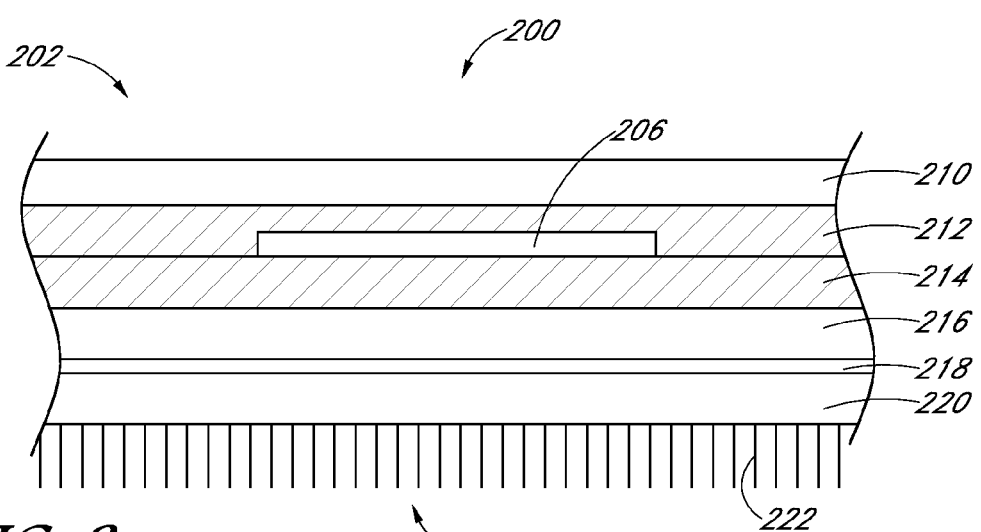
FIG. 2 illustrates a cross-sectional view of a PV module, according to some embodiments.

Similar to FIG. 1, FIG. 2 illustrates a cross-sectional view of a PV module. Unless otherwise specified below, the numerical indicators used to refer to components in FIG. 2 are similar to those used to refer to components or features in FIG. 1.

FIG. 2 illustrates a PV module 200, according to some embodiments. The PV module 200 can include a substantially transparent cover 210 made of glass or other substantially transparent material. In an embodiment, the substantially transparent cover 210 can be made of anti-reflective glass. The PV module 200 can also include one or more encapsulants which surround and enclose one or more solar cells, such as a first solar cell 206. In an embodiment with multiple solar cells, the first solar cell 206 can be coupled to a second solar cell. In an embodiment, an interconnect can be used to electrically couple the first and second solar cell together forming a solar cell string. In an embodiment, the PV module 200 and solar cell 206 can have a front side 202 that faces the sun during normal operation and a backside 204 opposite the front side 202.

In an embodiment, the PV module 200 can include a first and second encapsulant 212, 214. Encapsulants can be low or a high molecular weight polymers that can undergo liquid to solid transition during PV module manufacture. In a liquid state an encapsulant can coat a solar cell. In a liquid state, the first encapsulant 212 can have a viscosity in the range of 15,000-100,000 cP. Also in a liquid state, the first encapsulant 212 have self-leveling properties, e.g. the first encapsulant 212 can flow to form a substantially uniform film, for example, under the effect of gravity. In one embodiment, the first encapsulant can have a pot-life of greater than 1 hour after forming or dispensing. In an embodiment, the first encapsulant can be a silicone polymer such as polydimethylsiloxane. In an embodiment, the first encapsulant in a liquid state can be formed, or coated, on the substantially transparent cover 210 in a substantially uniform manner in a thickness range of 50-500 microns. As one example, a substantially uniform thickness of 50 microns does not necessarily mean that the thickness of the encapsulant is 50 microns across the full surface area of the encapsulant. As one example, a substantially uniform thickness of 50 microns could include minor variations within some tolerance range. For example, tolerance range could be +/−5 microns. Moreover, note that in some embodiments one or more edges of the encapsulant may taper to the substantially transparent cover such that substantially uniformity of thickness may apply to certain locations relative to the substantially transparent cover.

A curing or a cross-linking process can be used to change the first encapsulant 212 from a liquid to a solid state. In an embodiment, the first encapsulant 212 can start cross linking (e.g. liquid to solid transition) in a range between 75-200 deg-C. In an embodiment, the cross-linking can provide mechanical stability. In an embodiment, the first encapsulant 212 can inhibit cross-linking up to temperatures of 70 deg-C. In a solid state the first encapsulant 212 can provide structural support to the PV module 200.

In an embodiment, the cross-linking can include, but is not limited to, condensation polymerization, radical polymerization, UV initiated polymerization or metal assisted cross-linking. In some embodiments, fillers can be added to the first encapsulant 212, the fillers can include, but are not limited to, cyclic oligomers of silicones. In an embodiment, fillers can enhance the mechanical strength of the first encapsulant. In some embodiments, adding fillers does not reduce the light transmission of the encapsulant.

In some embodiments the first encapsulant 212 can be formed from a liquid encapsulant. In an embodiment, the first encapsulant 212 can be formed from plurality of encapsulant regions such as silicone regions or particles, or lines, among other examples. The first encapsulant 212 can be configured to prevent damage to the components of the PV module 200 from Ultraviolet light. In an embodiment, the first encapsulant 212 can have a refractive index greater than 1.35. In an embodiment, the first encapsulant 212 can have an adhesion to glass or metals (e.g. aluminum or copper) and silicon of greater than 10 N/cm.

In various embodiments, the second encapsulant 214 can also be formed from a liquid encapsulant or a flexible encapsulant. In an embodiment, the first and second encapsulants 212, 214 can be made of the same material. In some embodiments, the first and second encapsulants 212, 214 are made of different materials. In one embodiment, the second encapsulant 214 has a thickness greater than the first encapsulant 212. In an embodiment, the second encapsulant 214 can be made of a silicone polymer (e.g. similar to the first encapsulant). In some embodiments, the second encapsulant 214 can include a single or a combination of thermally conductive particles including, but not limited to, aluminum oxide, boron nitride and various ceramic particles used to enhance the thermal conductivity of the back encapsulant. For example, for concentrated solar applications, improved thermal heater transfer from the back side of the solar cells can enhance performance and extend life of the solar cells. Example thickness of the second encapsulant 214 can be in the range of 0.1-1.0 mm and/or can be greater than the thickness of the first encapsulant 212. In an example, the thickness of the second encapsulant is 0.25 mm.

In an embodiment, the second encapsulant 214 can include fillers for enhancing reflectivity (e.g. reflective fillers which reflect visible light wavelengths back into the solar cell). In some embodiment, the reflective fillers can include titanium oxide, calcium carbonate and various white pigments composed of organic or inorganic materials. In an embodiment, the second encapsulant can be colored white or substantially transparent. In one embodiment, fluorescent dyes can be added to the second encapsulant 214. These dyes can absorb radiation in the ultraviolet spectrum and emit light in the visible spectrum. In an embodiment, the second encapsulant 212 can be a flexible encapsulant (e.g., an ethylene-vinyl acetate (EVA) encapsulant, ionomer, polyvinylbutyryl (PVB) or poly olefin (PO) encapsulant).

The PV module 200 can also have a backsheet 216. The backsheet 216 can be an electrically insulating region which protects the underside of the PV module 200. The backsheet 216 can be a polymer sheet or composed of glass. The backsheet 216 can also be colored or substantially transparent. In an embodiment, the second encapsulant 214 can be configured to allow for efficient heat transfer between a solar cell 206 and a backsheet 216. In an embodiment, the backsheet 216 can also be a substantially transparent cover, e.g., for bifacial PV applications where light can be received from both the back side 204 and front side 202 of the PV module 200. In an embodiment, the backsheet 216 can be a metallic backsheet enhanced to facilitate a thermal pathway for the PV module 200.

In an embodiment, the substantially transparent cover 210, the first encapsulant 212, solar cell 206, second encapsulant 214 and the backsheet 216 can be cured and/or laminated in a step to form a PV laminate. In an embodiment, curing can include the process by which two interfaces (e.g., encapsulants with substantially transparent top cover and/or backsheet) are optically or thermally coupled and/or the process by which two materials are bonded together.

Concentrated photovoltaics (CPV) are systems where sun light is concentrated on solar cells via a system of lenses or mirrors. In an embodiment, the PV module 200 can be a concentrated PV module (e.g. CPV module) used in CPV systems or applications. An advantage of a CPV module is that it can allow for the use of less semiconductor per wattage of electricity produced (e.g. as compared to a one-sun PV module), reducing the cost of generated energy per watt. Increased light concentration can generate more heat for a CPV module compared to a PV module, where CPV modules have high thermal loads as compared to PV modules. CPV modules can require additional heat dissipation as compared to a PV module.

A heat sink 220 can be coupled to the backsheet 216 by a thermal interface material (TIM) 218. The heat sinks are metallic structures with extended surface area, such as the fins 222 shown in FIG. 2, which allow for heat to more rapidly escape from the CPV module. Thermal interface materials (TIM) 216 can be formed between the backsheet 216 and the heat sink 220 to adhere the heat sink 220 to the backsheet 216 and provide a medium for heat transfer between the backsheet 216 and the heat sink 220. In an embodiment, the fins 222 of the heat sink 220 can have a thickness range in the thickness of 0.25-1.0 mm. In an embodiment, the fins 222 of the heat sink 220 can have a fin-to-fin distance in the range from 2-10 mm. In an embodiment, the fin height of the fins 222 can range from 25-200 mm. In an embodiment, the heat sink is composed of a conductive metal (e.g. aluminum).

Figure 3:
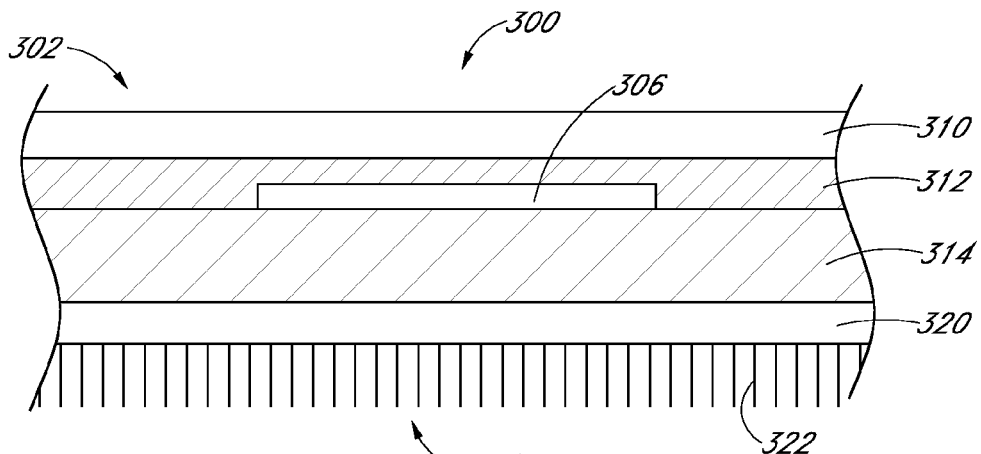
FIG. 3 illustrates a cross-sectional view of another PV module, according to some embodiments.

Similar to FIGS. 1 and 2, FIG. 3 illustrates cross-sectional views of a PV module. Unless otherwise specified below, the numerical indicators used to refer to components in FIG. 3 are similar to those used to refer to components or features in FIGS. 1 and 2.

The PV module 300 can include a substantially transparent cover 310 made of glass or other substantially transparent material. The PV module 300 can also include one or more encapsulants which surround and enclose one or more solar cells, such as a first solar cell 306. In an embodiment, the PV module 300 and solar cell 306 can have a front side 302 that faces the sun during normal operation and a backside 304 opposite the front side 302. In an embodiment, the PV module 300 can include a first and second encapsulant 312, 314. The PV module 300 can also include a heat sink 322 with fins 324.

The first encapsulant 312 can have the same or similar properties to the first encapsulant 212 of FIG. 2 where the numerical indicators used to refer to the first encapsulant 312 are similar to those used to refer to components or features of the first encapsulant 212 of FIG. 2.

The second encapsulant 314 can have similar properties to the second encapsulant 214 of FIG. 2 where the numerical indicators used to refer to the first encapsulant 314 are similar to those used to refer to components or features of the first encapsulant 214 of FIG. 2.

Generally the formation of an encapsulant on the back side 304 of the PV module includes curing an encapsulant on the back side 304 of the PV module 300 and subsequently attaching a heat sink to the encapsulant using a Thermal Interface Material (TIM). Applying a TIM to the back side of a PV module including can add additional thermal resistance which can reduce the thermal performance of the PV module. To simplify processing and reduce cost and thermal resistance, in an embodiment, the second encapsulant 314 can replace or combine the functionalities of an encapsulant on the back side of the PV module, a backsheet and a thermal interface material (TIM), e.g., the second encapsulant can replace the backsheet and thermal interface material (TIM).

In an embodiment, the second encapsulant 314 can include a single or a combination of thermally conductive particles including, but not limited to, aluminum oxide, boron nitride and various ceramic particles used to enhance the thermal conductivity of the back encapsulant. Various thickness of the second encapsulant 314 can be used in various embodiments. In one embodiment, the thickness of the second encapsulant 314 can be greater than the thickness of the first encapsulant 312. In an example, the thickness of the second encapsulant 314 can be greater than 0.25 mm.

In an embodiment, the second encapsulant 314 can include fillers for enhancing reflectivity (e.g. reflective fillers which reflect visible light wavelengths back into the solar cell). In some embodiments, the reflective fillers can include titanium oxide, calcium carbonate and various white pigments composed of organic or inorganic materials. In an embodiment, the second encapsulant 314 can be color white. In one embodiment, fluorescent dyes can be added to the back encapsulant 314. These dyes can absorb radiations in ultra violet spectrum and reflect back light in the visible spectrum.

In an embodiment, the second encapsulant 314 can couple to the solar cell 306 and directly to a heat sink 320, where the second encapsulant 314 is configured to allow thermal communication between the solar cell 206 and the heat sink 320 directly without a backsheet and TIM. In an embodiment, the second encapsulant 314 can be a thermally conductive encapsulant. In one embodiment, the second encapsulant 314 can have a thermal conductivity greater than 0.4 W/m-K. In an embodiment, the second encapsulant 314 can have an electrical resistance greater than $1 \times 10^{13}$. In an embodiment, the second encapsulant 314 can have a tensile strength in the range of 0.5-6 MPa. In an embodiment, the second encapsulant 314 can have a dielectric breakdown in the range of 250-550 V/mil. In one embodiment, the second encapsulant 314 can have an elongation break of 10-100 percent (%).

In an embodiment, the substantially transparent cover 310, the first encapsulant 312, solar cell 306, second encapsulant 314 and heat sink 320 can be cured and/or heated in a step to form the PV module. In an embodiment, curing can include the process by which two interfaces (e.g., encapsulants with substantially transparent cover) are optically or thermally coupled and/or the process by which two materials are bonded together.

In an embodiment, the PV module 300 can be a CPV module used in CPV systems or applications.

Figure 4:
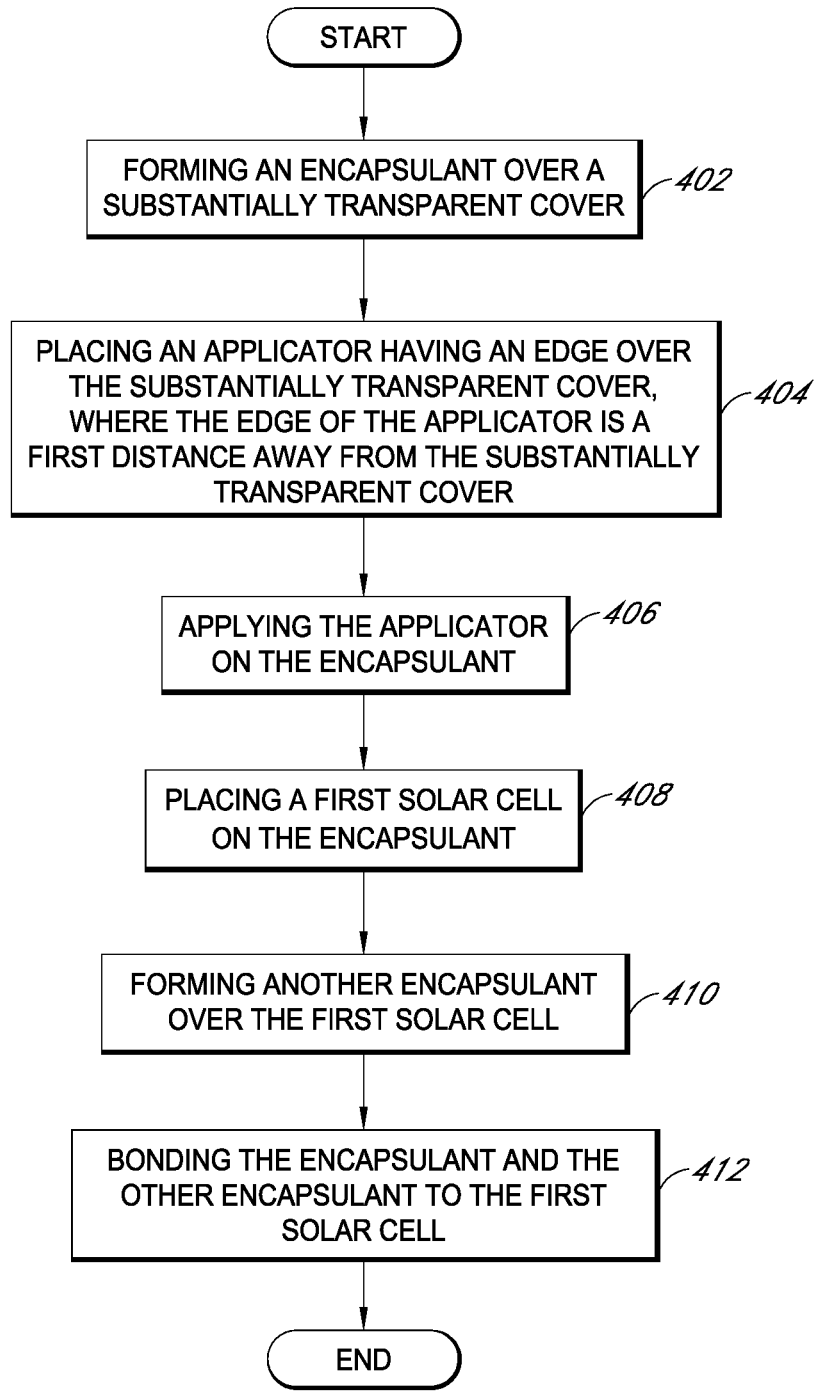
FIG. 4 illustrates a flowchart representation of a method for manufacturing a PV module, according to some embodiments.

Turning now to FIG. 4, a flow chart for a method for manufacturing a PV module is illustrated, according to some embodiments. In various embodiments, the method of FIG. 4 may include additional (or fewer) blocks than illustrated. For example, in some embodiments, a liquid back encapsulant can be used and an additional spreading of the back encapsulant can also be performed.

As shown in 402, an encapsulant can be formed over a substantially transparent cover. In an embodiment, the encapsulant can be the first encapsulant described in FIG. 2. In an embodiment, the encapsulant is applied to the cover in a liquid state, for example with a viscosity in the range of 15,000-100,00 cP, which can help the spreadability of the liquid encapsulant.

The encapsulant can be applied as a plurality of encapsulant regions. For instance, the encapsulant regions can be applied as silicon particles, lines, or other shapes. In an embodiment, the silicon lines are regularly spaced apart every approximately 1-25 cm and can be formed in a direction corresponding to the shorter dimension of the cover or in a direction corresponding to the longer dimension of the cover. In one embodiment, multiple parallel groups of encapsulant regions can be formed with each parallel group being in the same direction. In an embodiment, the silicone regions can have a thickness of 1-10 cm.

In an embodiment, the plurality of encapsulant regions can be applied in a direction, such as a first direction.

In an embodiment, the encapsulant can have self-leveling properties, e.g., so the encapsulant can flow to form a substantially uniform film under the effect of gravity. In one embodiment, the encapsulant can have a pot-life of greater than 1 hour after forming or dispensing. In an embodiment, the encapsulant can be a silicone polymer such as polydimethylsiloxane. In an embodiment, the encapsulant can have a refractive index greater than 1.35. In an embodiment, the encapsulant can have an increased adhesion to glass, silicone, metals (e.g. aluminum or copper) and silicone of greater than 10 N/cm.

Figure 5:
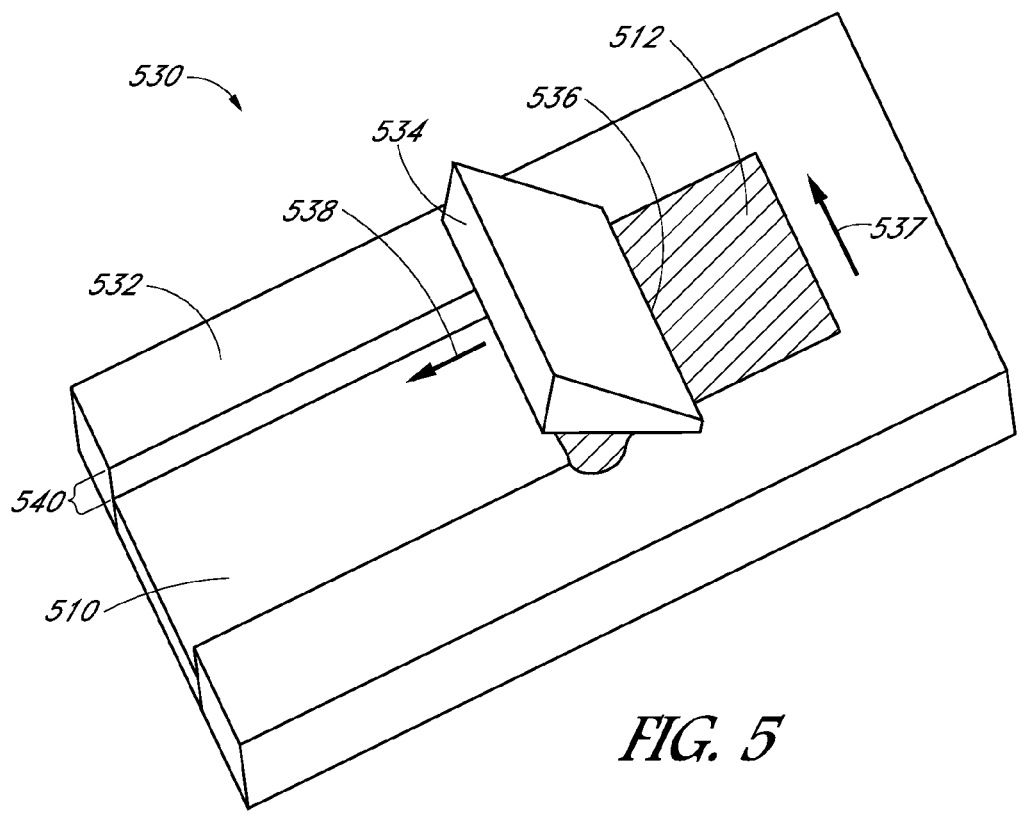
FIG. 5 illustrates a plan view of an encapsulant application system, according to some embodiments.
Figure 6:
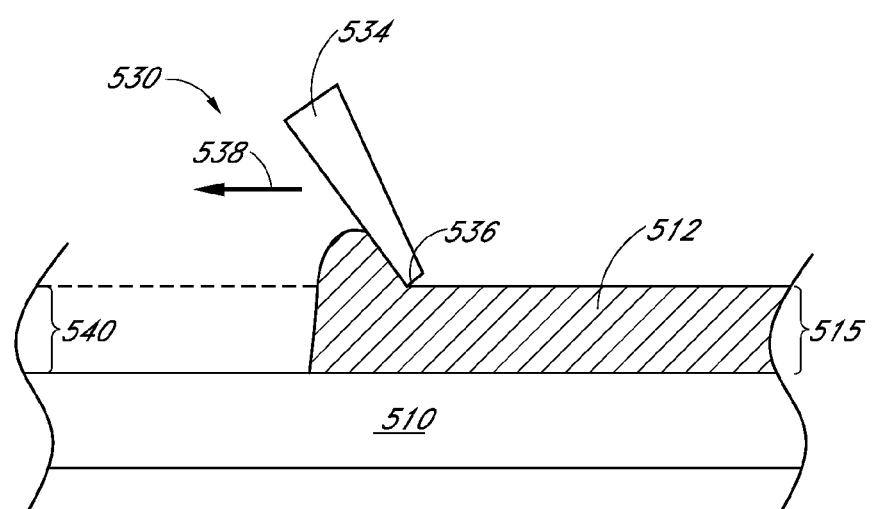
FIG. 6 illustrates a cross-sectional view of the encapsulant application system from FIG. 5, according to some embodiments.

In an embodiment, the encapsulant can be spread on the substantially transparent cover as described at 404 and 406 and shown in FIGS. 5 and 6.

At 404, an applicator can be placed with its edge a non-zero distance away from the substantially transparent cover. In an embodiment, the non-zero distance can be 0.05-2.0 mm away from the substantially transparent cover. In an embodiment, the encapsulant can be formed, or coated, on the substantially transparent cover substantially uniformly in a range of 50-500 microns. In an embodiment, the applicator can be a blade, a glass blade, a squeegee or a rubber squeegee.

At 406, the applicator can be applied in a second direction on the encapsulant, where the second direction is transverse (e.g., perpendicular, 70 degrees offset) to the direction of application of the encapsulant regions. For example, if the encapsulant regions were applied in the direction corresponding to the shortest dimension of the cover, the applicator can be applied transverse to that direction (e.g., the applicator can be applied in a direction corresponding to the longest dimension of the top cover). In an embodiment, applying the applicator in such a manner allows for substantially uniformly spreading of the encpasulant. In an embodiment, gravity can be used in addition to, or instead of the applicator, to substantially uniformly spread the encapsulant. The spread encapsulant can have a thickness of approximately 50-500 microns.

At 408, a first solar cell, or a string of solar cells, can be placed on the encapsulant. In an embodiment, the first solar cell can be coupled to another solar cell via an interconnect At 410 another encapsulant can be formed over the first solar cell. In an embodiment, the other encapsulant can be flexible encapsulant e.g. an ethylene-vinyl acetate (EVA) encapsulant, or can be a liquid encapsulant, such as those described at FIGS. 1-3. If the encapsulant formed at 410 is applied in a liquid state, applying and spreading of the other liquid encapsulant can occur in substantially the same manner as described at 402, 404, and 406. In an embodiment, the second encapsulant can be a silicone polymer. In on embodiment, the second encapsulant can have higher thermal conductivity than the first polymer.

At 412, the encapsulant and the other encapsulant can be bonded to the first solar cell. In an embodiment, the bonding can include curing the encapsulant and the other encapsulant. In an embodiment, the bonding can include performing a cross-linking process. In an embodiment, the cross-linking process can include, but is not limited to, condensation polymerization, radical polymerization or metal-assisted cross linking. In an embodiment, the first encapsulant can start cross linking (e.g. liquid to solid transition) in a range between 75-200 deg-C. In an embodiment, the cross-linking can provide mechanical stability. In an embodiment, the first encapsulant can inhibit cross-linking up to temperatures of 70 deg-C. In a solid state, the first encapsulant can provide structural support to the PV module. In one embodiment, vacuums can be used in the bonding process to remove any trapped air.

FIG. 5 illustrates a plan view of an encapsulant application system, according to some embodiments. The encpasulant application system 530 can include an encapsulant jig 532 and an applicator 534. The applicator 534 can be placed with its edge 536 a non-zero distance away 540 from the substantially transparent cover 510. In an embodiment, the non-zero distance 540 can be 0.05-2.0 mm away from the substantially transparent cover 510. In other embodiments, the edge 536 of the applicator can be applied to the surface of the substantially transparent cover (e.g., a zero distance away). Prior to placing the applicator 534 a non-zero distance away 540 from the substantially transparent cover 510, the encapsulant 512 can be formed and/or dispensed in a first direction 537 on the substantially transparent cover 510. The applicator can be applied in a second direction 538 on the encapsulant 512, where the second direction 538 is transverse (e.g., perpendicular, 70 degrees offset, etc.) to the first direction 537 of application of the encapsulant 512.

Similar to FIG. 5, FIG. 6 illustrates a cross-sectional view of the encpasulant application system 530. Unless otherwise specified below, the numerical indicators used to refer to components in FIG. 5 are similar to those used to refer to components or features in FIG. 6.

With reference to FIG. 6, a cross-sectional view of the encapsulant application system from FIG. 5 is shown, according to some embodiments. In an embodiment, the applicator 534 can be a blade, a glass blade, a squeegee or a rubber squeegee. The applicator 534 can be applied in a direction 538 on the encapsulant, as shown in FIG. 5. In an embodiment, applicator 534 can be placed with its edge 536 a non-zero distance away 540 from the substantially transparent cover 510. In an embodiment, the encapsulant 512 can be formed, or coated, on the substantially transparent cover substantially uniformly resulting in a thickness 515. In one embodiment, the non-zero distance 540 can define the thickness 515 of the encapsulant 512. In some embodiments, the thickness 515 can be the same as the non-zero distance 540. In an embodiment, applying the applicator 534 with the edge 536 a non-zero distance 540 away from the substantially transparent cover 510 can allow for a substantially uniform thickness 515 of the encapsulant 512. In an embodiment, the thickness 515 can be in the range of 50-500 microns.

Figure 7:
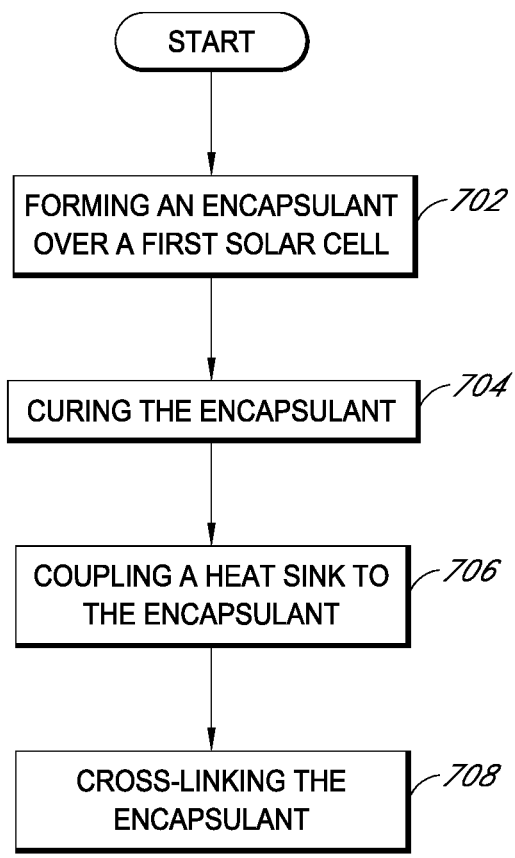
FIG. 7 illustrates a flowchart representation of another method for manufacturing a PV module, according to some embodiments.

FIG. 7 illustrates a flow chart for another method for manufacturing a PV module, according to some embodiments. In various embodiments, the method of FIG. 7 may include additional (or fewer) blocks than illustrated. For example, in some embodiments, one or more blocks of the method of FIG. 4 can be used in conjunction with the method of FIG. 7.

As shown in 702 and similar to 410, an encapsulant can be formed over a first solar cell. In one embodiment, the encapsulant can be formed over a back side of the first solar cell. In an embodiment, the encapsulant can be any of the encapsulants discussed in FIGS. 1-3, such as the encapsulant with thermal interface properties that can be used in a CPV application without a separate TIM and backsheet. In an embodiment, a vacuum can be applied to the encapsulant to remove air pockets or voids. In one embodiment, applying a vacuum can form substantially uniform encapsulant (e.g. a void and/or air-pocket free encapsulant).

At 704, the liquid encapsulant can be cured. In an embodiment, the curing can include performing a cross-linking process. In an embodiment, the cross-linking process can include, but is not limited to, addition polymerization, condensation polymerization, radical polymerization or metal assisted cross-linking.

At 706, a heat sink can be coupled directly to the encapsulant. In an embodiment, coupling the heat sink to the encapsulant can include heating. In an embodiment, the encapsulant can be heated to temperatures greater than 100 deg-C after the heat sink is attached. In one embodiment, the heat sink can be coupled to a thermal interface material ("TIM"), where the TIM couples the heat sink to the encapsulant. In an embodiment, coupling the heat sink to the encapsualnt using the TIM can include heating.

At 708, a cross-linking process can be performed on the encapsulant. In an embodiment, the cross-linking process can include, but is not limited to, condensation polymerization, radical polymerization or metal assisted cross-linking.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method for manufacturing a photovoltaic (PV) module, the method comprising:
   forming a plurality of encapsulant regions on a substantially transparent cover;
   spreading the plurality of encapsulant regions on the substantially transparent cover;
   placing a first solar cell on the plurality of encapsulant regions;
   placing another encapsulant over the first solar cell;
   bonding the plurality of encapsulant regions and the another encapsulant to the first solar cell;
   forming a backsheet on the another encapsulant;
   forming a thermal interface material (TIM) on the backsheet;
   forming a heat sink on the TIM; and
   forming fins on the heat sink.

2. The method of claim 1, wherein spreading the plurality of encapsulant regions comprises:
   placing an edge of an applicator over the substantially transparent cover; and
   applying the applicator on the plurality of encapsulant regions.

3. The method of claim 2, wherein placing the edge of the applicator includes placing the edge of the applicator 0.1-2.0 mm away from the substantially transparent cover.

4. The method of claim 2, further comprising:
placing an edge of an applicator a distance away from the substantially transparent cover; and
applying the applicator to the plurality of encapsulant regions, wherein placing an edge of an applicator a distance away from the substantially transparent cover substantially uniformly forms the plurality encapsulant regions with a thickness in a range of 50-500 microns.

5. The method of claim 2, wherein applying the applicator substantially uniformly spreads the plurality of encapsulant regions.

6. The method of claim 2, wherein applying an applicator comprises applying a blade, a glass blade, a squeegee or a rubber squeegee on the plurality of encapsulant regions.

7. The method of claim 1, wherein forming a plurality of encapsulant regions comprises forming a plurality of silicon lines.

8. The method of claim 1, wherein forming the plurality of silicon lines comprises regularly spacing the plurality of encapsulant regions approximately 1-25 cm apart.

9. The method of claim 1, wherein bonding the plurality of encapsulant regions and the another encapsulant comprises curing the plurality of encapsulant regions and the another encapsulant.

10. The method of claim 1, wherein bonding the plurality of encapsulant regions and the another encapsulant comprises cross-linking the plurality of encapsulant regions and the another encapsulant.

11. A method for manufacturing a photovoltaic (PV) module, the method comprising:
forming a liquid encapsulant in a first direction on a substantially transparent cover;
applying an applicator in a second direction to the liquid encapsulant, wherein the second direction is different than the first direction;
placing a first solar cell on the liquid encapsulant;
forming another encapsulant over the first solar cell;
bonding the liquid encapsulant and the another encapsulant to the first solar cell;
forming a backsheet on the another encapsulant;
forming a thermal interface material (TIM) on the backsheet;
forming a heat sink on the TIM; and
forming fins on the heat sink.

12. The method of claim 11, applying the applicator includes applying an edge of the applicator approximately 0.1-2.0 mm away from the substantially transparent cover.

13. The method of claim 11, wherein applying the applicator in a second direction substantially uniformly spreads the liquid encapsulant over the substantially transparent cover.

14. The method of claim 11, wherein applying the applicator comprises applying a blade, a glass blade, a squeegee or a rubber squeegee on the plurality of encapsulant regions.

15. The method of claim 11, wherein forming the liquid encapsulant comprises forming a plurality of silicon lines.

16. A method for manufacturing a photovoltaic (PV) module, the method comprising:
forming a plurality of encapsulant regions on a cover;
spreading the plurality of encapsulant regions on the cover;
placing a first solar cell on the plurality of encapsulant regions;
placing another encapsulant over the first solar cell;
bonding the plurality of encapsulant regions and the another encapsulant to the first solar cell;
forming a backsheet on the another encapsulant;
forming a thermal interface material (TIM) on the backsheet;
forming a heat sink on the TIM; and
forming fins on the heat sink.

17. The method of claim 16, wherein spreading the plurality of encapsulant regions comprises:
placing an edge of an applicator over the cover; and
applying the applicator on the plurality of encapsulant regions.

18. The method of claim 17, wherein placing the edge of the applicator includes placing the edge of the applicator 0.1-2.0 mm away from the cover.

19. The method of claim 17, further comprising:
placing an edge of an applicator a distance away from the cover; and
applying the applicator to the plurality of encapsulant regions, wherein placing an edge of an applicator a distance away from the cover substantially uniformly forms the plurality encapsulant regions with a thickness in a range of 50-500 microns.

20. The method of claim 17, wherein applying the applicator substantially uniformly spreads the plurality of encapsulant regions.

* * * * *